United States Patent [19]

Ida

[11] Patent Number: 4,644,153
[45] Date of Patent: Feb. 17, 1987

[54] OPTICAL SENSING EQUIPMENT
[75] Inventor: Yoshiaki Ida, Hyogo, Japan
[73] Assignee: Mitsubishi Denki Kabushiki Kaisha, Tokyo, Japan
[21] Appl. No.: 777,135
[22] Filed: Sep. 18, 1985
[30] Foreign Application Priority Data Sep. 18, 1984 [JP] Japan ................................ 59-197249
Sep. 18, 1984 [JP] Japan ................................ 59-197250

[51] Int. Cl.$^4$ ............................................. G02F 1/01
[52] U.S. Cl. .................................... 250/225; 250/227
[58] Field of Search ................... 250/225, 227, 231 R, 250/231 P; 73/705; 350/96.15, 96.29

[56] References Cited
U.S. PATENT DOCUMENTS 3,980,567  9/1976  Benini .............................. 250/227 X
4,090,794  5/1978  Benini .......................... 250/223 R X Primary Examiner—Eugene R. LaRoche
Assistant Examiner—James C. Lee
Attorney, Agent, or Firm—Sughrue, Mion, Zinn, Macpeak, and Seas

[57] ABSTRACT

An optical sensing equipment for measuring quantities such as a displacement, pressure, electric voltage or field, and magnetic current or field, wherein errors due to fluctuations in the outputs of light sources and transmission losses of optical fibers are eliminated. First and second light sources are alternately activated, and ratios of their outputs are determined in both cases. Then, the ratio of these two outputs is calculated to thereby provide a signal representing the quantity being measured. The optical sensing equipment is arranged such that terms affected by fluctuations in the outputs of the light sources and transmission losses in optical fibers used in the optical sensing equipment cancel out in the divisions providing the three ratios.

12 Claims, 3 Drawing Figures

OPTICAL SENSING EQUIPMENT

BACKGROUND OF THE INVENTION

The present invention relates to an optical sensing equipment utilizing polarized light, and more specifically to an optical sensing equipment for optically measuring the quantity of light transmitted through an optical fiber.

FIG. 1 is a block diagram illustrating a conventional optical sensing equipment utilizing polarized light. In FIG. 1, there is shown an arrangement of a light source 1, an optical fiber 2, a micro lens 3, and a polarizer 4, wherein the light emitted from the light source 1 is changed by the micro lens 3 into a parallel beam, which passes through the optical fiber 2 before being converted by the polarizer 4 into linearly polarized light.

The arrangement includes a photoelastic element 5, a quarter-wave plate 6, and analyzer 7 for dividing the light into two vertically polarized components, micro lenses 8 and 9, optical fibers 10 and 11, photodetectors 12 and 13, an adder 14, a subtractor 15, and a divider 16.

The photoelastic element 5 is arranged so that a pressure being measured is applied to one face thereof. A double-refractive phenomenon is caused due to the applied pressure. For instance, provided that the photoelastic element 5 is an isotropic medium, the refractive index in the direction in which the pressure is applied becomes different from the refractive indexes in the two directions perpendicular thereto. Accordingly, if a light beam having a field component in the pressure-applied direction and another light beam having a field component perpendicular to the former are simultaneously incident on the photoelastic element 5, a phase difference will occur at the output thereof. For instance, if the linearly polarized light of the output of the polarizer 4 is incident on the photoelastic element 5 at an angle of 45° with respect to the optical axis, the output of the photoelastic element 5 will be elliptically polarized in an amount depending on the pressure.

The elliptically polarized light is imparted by the quarter-wave plate 6 a phase difference of 90° and an optical bias, and then divided by the analyzer 7 into two polarized components perpendicular to each other. The two components are focused by the micro lenses 8 and 9, passed through the optical fibers 10 and 11, and then subjected to photoelectric conversion by the photodetectors 12 and 13.

The sum of and difference between the photodetector outputs are determined by the adder 14 and the subtractor 15, whereas the division of them is carried out by the divider 16. An output is thereby produced indicative of the pressure, which output is not affected by variations in the intensity of the light source 1.

Although the photoelastic element 5 is employed as a sensor element in the aforementioned example in which a pressure is measured, a Faraday element or Pockels element may be used in the case of measuring a magnetic or electric magnetic field.

Since the photomodulated light is transmitted through the two optical fibers 10 and 11 from the optical sensor arrangement composed of the optical fiber 2 through the micro lens 9, the conventional optical sensing equipment thus constructed has such a disadvantage that optical loss fluctuations between the optical fibers 10 and 11 cause errors in measurement.

SUMMARY OF THE INVENTION

The invention is intended to eliminate such a drawback. It is therefore an object of the present invention to provide an optical sensing equipment capable of measuring a quantity accurately without being affected by loss fluctuations of the light source, optical fibers, etc.

In the optical sensing equipment according to the present invention, only two optical fibers are connected to optical sensor means, each optical fiber being provided with a light source and a photodetector at the other end thereof, and the light sources are alternately driven on a time division basis. Two polarized components perpendicular to each other are modulated by reflex optical sensor means and subjected to photoelectric conversion by the photodetector at the end of each optical fiber and a photodetector at the end of each optical fiber, and a photodetector-to-photodetector output ratio is obtained synchronously with the generation of an output by the light source before being subjected to division. With this arrangement, an optical sensing equipment is provided which is free from the affects of transmission loss fluctuations in the optical fibers.

In another embodiment of the invention, in order to modulate one of two light sources, a half-silvered mirror is provided at the end of the optical sensor means. By taking a output ratio of one photodetector to another photodetector when the respective light sources are turned on, and further taking a ratio of those two ratios, the effects of losses in the optical fibers and fluctuations of the light sources are eliminated in the optical sensing equipment according to the present invention.

In accordance with the present invention, as only two optical fibers are connected to the optical sensor means, each optical fiber being provided with a light source and a photoreceiver at the other end thereof, and the light sources are alternately drive in a time division basis and then a photodetector-to-photodetector ratio is subjected to division for obtaining an output proportional to the quantity being measured, all effects of transmission loss fluctuations in the optical fibers are avoided.

DESCRIPTION OF THE PREFERRED EMBODIMENTS

Figure 1:
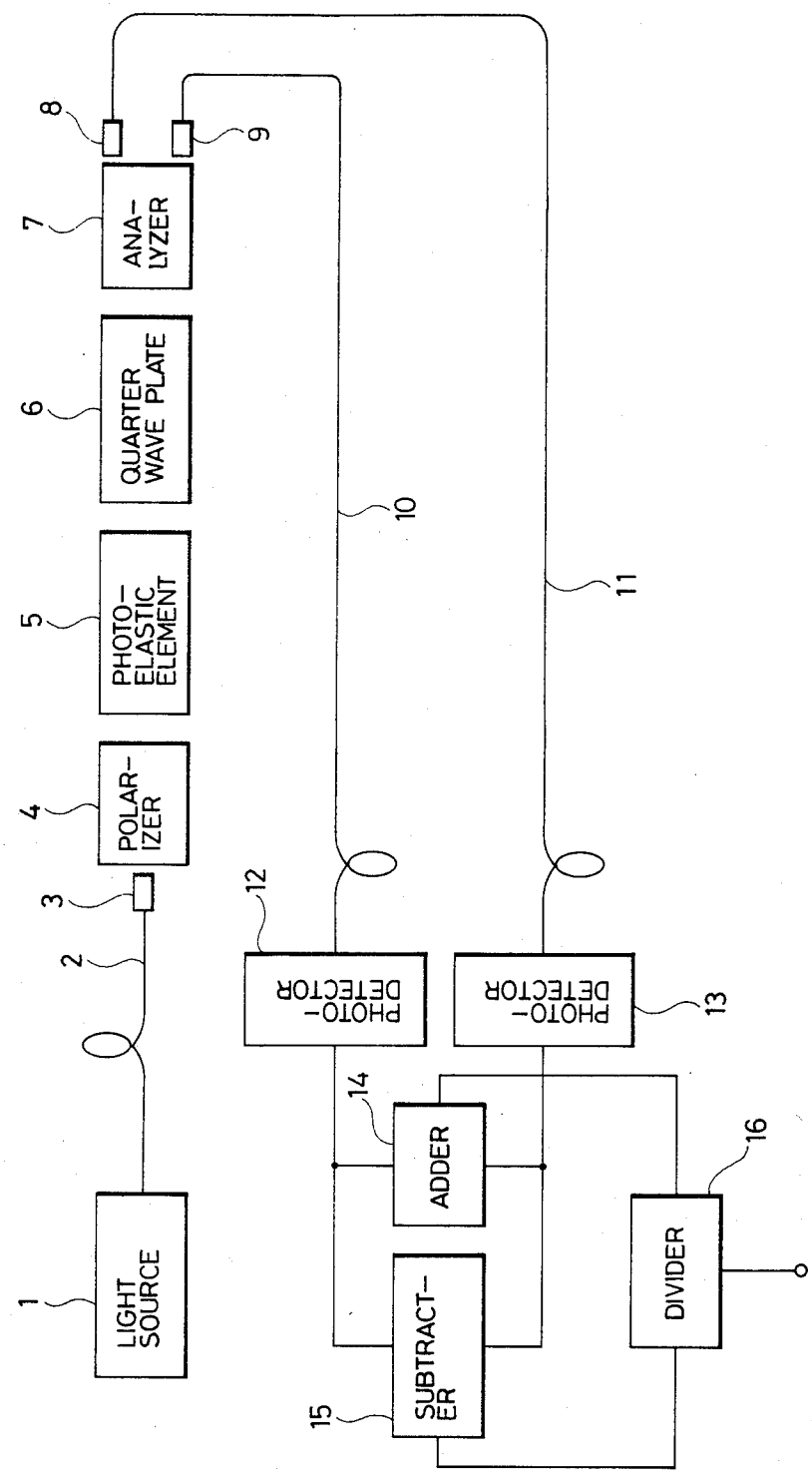
FIG. 1 is a block diagram of a conventional optical sensing equipment.

Referring now to the drawings, preferred embodiments of the present invention will be described.

Figure 2:
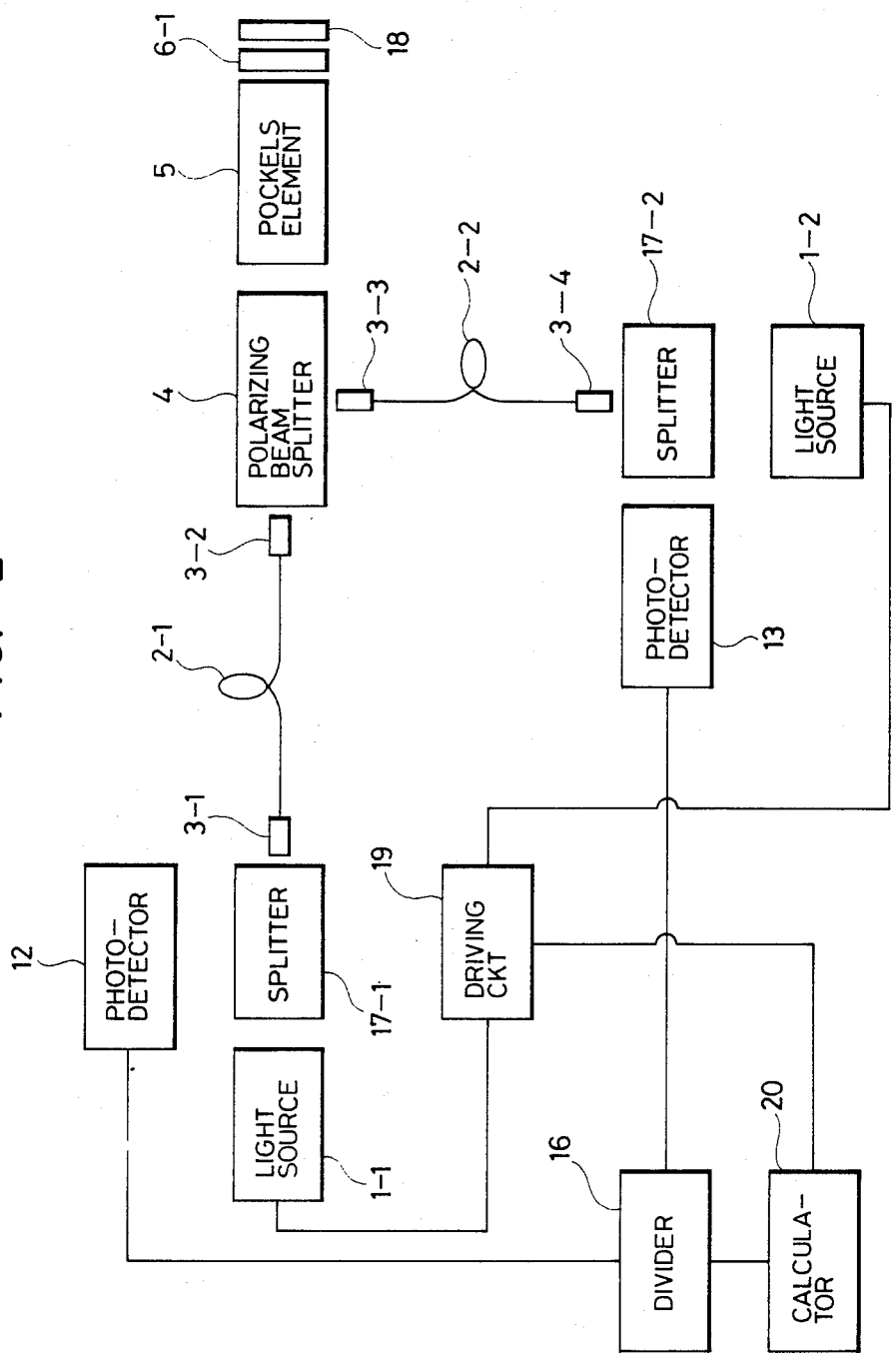
FIG. 2 is a block diagram of an optical sensing equipment embodying the present invention.

In FIG. 2, there is shown an arrangement of light sources 1-1 and 1-2 such as LEDs; splitters 17-1 and 17-2 for respectively guiding the light emitted from the light sources 1-1 and 1-2 to micro lenses 3-1 and 3-4 and the light radiated from the micro lenses 3-1 and 3-4 to photodetectors 12 and 13; optical fibers 2-1 and 2-2; micro lenses 3-2 and 3-3; a polarizing beam splitter 4 used as a polarizer; a modulator element 5, which is a Pockels element wherein polarized light is modulated according to the electric field; an eighth-wave plate 6-1; a fully reflecting mirror 18; a driving circuit for alternately driving the light sources 1-1 and 1-2; a divider 16 for forming a photodetector-to-photodetector (12 to 13) output ratio; and a calculator 20 for calculating the ratio of the photodetector-tophotodetector output ratio when the light source 1-1 is turned on to same ratio when the second light source 1-2 is turned on with the aid of a synchronizing signal from the driving circuit 19, thus computing an output proportional to a quantity being measured.

In the optical sensing equipment thus constructed, light is allowed to pass through the splitter 17-1, is focused by the micro lens 3-1, and is incident on the optical fiber 2-1 while the light source 1-1 is turned on. The light is converted into a parallel beam by the micro lens 3-2, and linearly polarized light (transmitted light) in a certain direction is made incident on the Pockels element 5 by the optical beam splitter 4, whereas any other linearly polarized light (reflected light) perpendicular to the former is emitted in the direction opposite to the micro lens 3-3 and is not utilized. The light which has passed through the Pockels element 5 undergoes an electro-optic effect therein, undergoing a double-refractive phenomenon because of the electric field. Although the light is given an optical bias by the eighth-wave plate 6-1 again, this case is equivalent to one where it is allowed to pass through a quarter-wave phase plate once.

The light is again modulated by the Pockels element 5 and divided by the polarizing beam splitter 4 into two polarized components perpendicularly crossing each other, these components being respectively incident on the micro-lenses 3-2 and 3-3. The former is made to return to the aforementioned passage and is branched off by the splitter 17-1 and then subjected to photoelectric conversion by the photodetector 12. On the other hand, the latter is focussed by the micro lens 3-3, passed through the optical fiber 2-2, changed into a parallel beam by the micro lens 3-4, branched by the splitter 17-2, and applied the photoreceiver 13 for photoelectric conversion. Although the same phenomenon is produced when the light source 1-2 is turned on, the light reflected from the polarizing beam splitter 4 in that case is made incident on the Pockels element 5.

In other words, the following calculations are made:

When the light source 1-1 is turned on, output of the photoreceiver 12: $D_{1-1}$, output of the photoreceiver 13: $D_{2-1}$; and when the light source 1-2 is turned on, output of the photoreceiver 12: $D_{1-2}$, output of the photoreceiver 13; $D_{2-2}$ are respectively:

$$D_{1-1} \propto P_1 \cdot \tfrac{1}{2} \cdot K_1 \cdot \tfrac{1}{2} \cdot (\beta+\alpha) \cdot K_1 \cdot \tfrac{1}{2} \quad (1)$$

$$D_{2-1} \propto P_1 \cdot \tfrac{1}{2} \cdot K_1 \cdot \tfrac{1}{2} \cdot (\beta-\alpha) \cdot K_2 \cdot \tfrac{1}{2} \quad (2)$$

$$D_{1-2} \propto P_2 \cdot \tfrac{1}{2} \cdot K_2 \cdot \tfrac{1}{2} \cdot (\beta-\alpha) \cdot K_1 \cdot \tfrac{1}{2} \quad (3)$$

$$D_{2-2} \propto P_2 \cdot \tfrac{1}{2} \cdot K_2 \cdot \tfrac{1}{2} \cdot (\beta+\alpha) \cdot K_2 \cdot \tfrac{1}{2} \quad (4)$$

where:
intensity of the light source $1-1 = P_1$,
intensity of the light source $1-2 = P_2$,
coupling factor of the splitter $17-1 = \tfrac{1}{2}$,
transmission factor of the optical fiber 2-1 (including the micro lenses 3-1, 3-2) $= K_2$,
coupling factor of the splitter $17-2 = \tfrac{1}{2}$,
transmission factor of the modulated light incident on and radiated from the polarizing beam splitter 4, the Pockels element 5, the eight-wave plate 6-1 and the fully reflecting mirror $18 = a$, and transmission factor of the unmodulated light $=$.

If expression (1) is divided by expression (2) and expression (3) by expression (4), the following are obtained, respectively:

$$D_{1-1}/D_{2-1} \propto \beta+\alpha/\beta-\alpha \cdot K_1/K_2 \quad (5)$$

$$D_{1-2}/D_{2-1} \propto \beta-\alpha/\beta+\alpha \cdot K_1/K_2 \quad (6)$$

If expression (5) is divided by expression (6), $$\propto (\beta+\alpha/\beta-\alpha)^2 \quad (7)$$

Thus, the factors depending on the intensities of the light sources and the transmission losses of the optical fibers are eliminated.

Since the transmission factor $\beta$ of the unmodulated light is made free from the effects of loss fluctuations in the light sources and the optical fibers through the divisions and is $\tfrac{1}{2}$, $\alpha$ can be accurately obtained ($\alpha$ is proportional to the quantity being measured).

The divider 16 is used to obtain the photodetector-to-photodetector (12 to 13) output ratio when the light source 1-1 is turned on and when the light source 1-2 is turned on, and the calculator 20 is used to divide the former by the latter so as to calculate an output proportional to the quantity being measured.

Although a Pockels element is used as a modulator element in the embodiment described above, a bismuth-silicon-oxide ($Bi_{12}SiO_{20}$) element may be used. When an electric field or voltage is to be measured, an eighth-wave plate may be inserted between the polarizer and the modulator element, and, when a magnetic field of current is measured, the length of the bismuth-germaniumoxide or bismuth-silicon-oxide element is determined so that the plane of polarization is rotated 45° in terms of rotary power.

A material having a photoelastic effect may be used for the modulator element, and, when a pressure is to be measured, an eighth-wave plate may be inserted between the polarizer and the modulator element. A Faraday element may also be used as the modulator element. Moreover, polarizing beam splitters are usable as the splitters 17-1 and 17-2.

Figure 3:
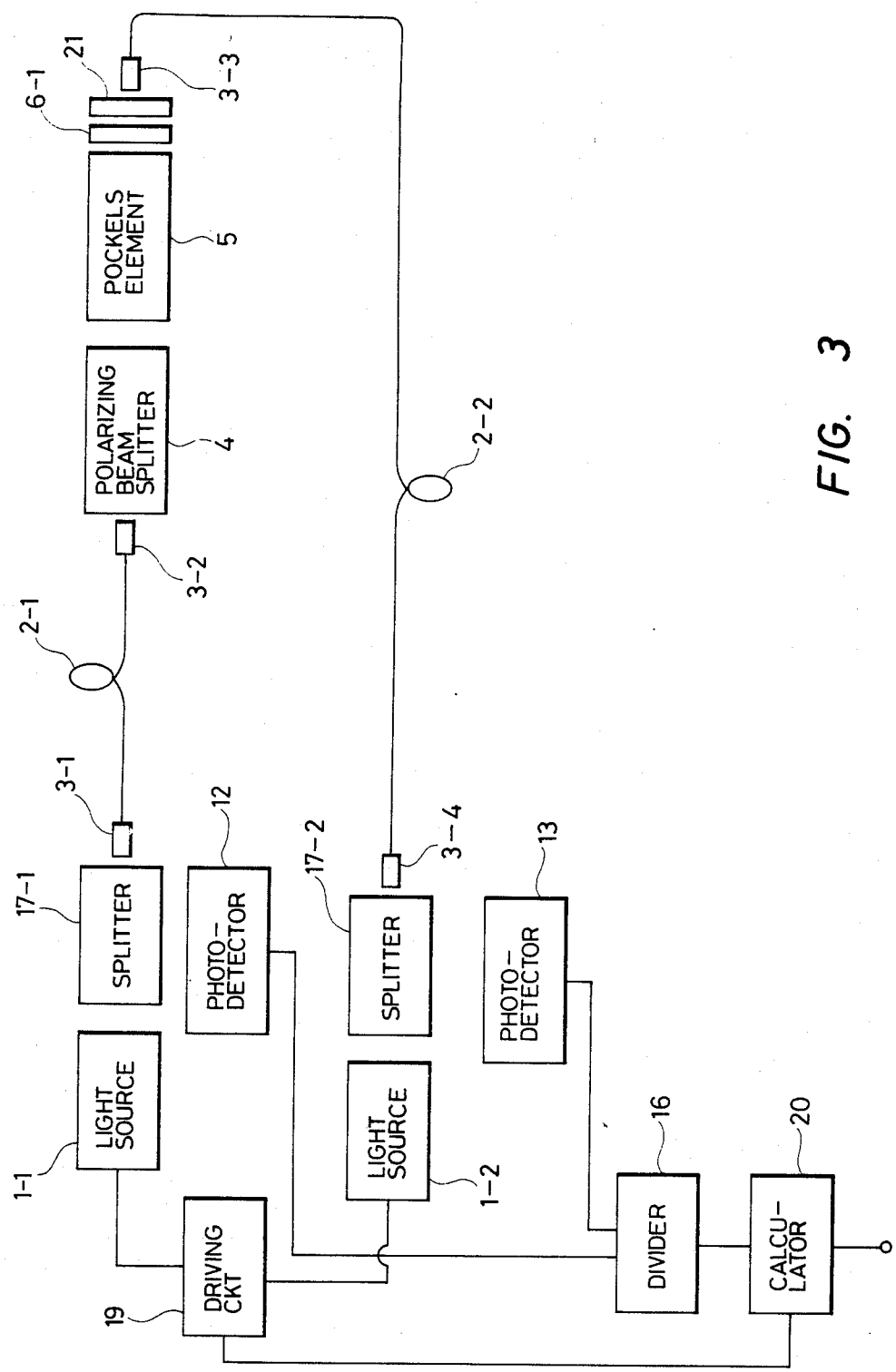
FIG. 3 is a block diagram of another embodiment of an optical sensing equipment of the invention.

Referring now to FIG. 3 of the drawings, a second preferred embodiment of the present invention will be described. In FIGS. 2 and 3, like reference numerals identify like elements.

In FIG. 3 there is shown an arrangement of light sources 1-1 and 1-2, splitters 17-1 and 17-2 for guiding the light emitted from the light sources 1-1 and 1-2 and light radiated from micro lenses 3-1 and 3-4 to photodetectors 12 and 13, respectively, optical fibers 2-1 and 2-2, micro lenses 3-2 and 3-3, a polarizing beam splitter 4 used as a polarizer, a modulator element 5 (Pockels element) wherein polarized light is modulated according to the electric field, a eighth-wave plate 6-1, a half-silvered mirror 21, a driving circuit for alternately driving the light sources 1-1 and 1-2, a divider 16 for calculating a ratio between the output of the photodetectors 12 and 13, and a calculator 20 for calculating the ratio of the ratio of the outputs of the photodetectors 12 and 13 when the light source 1-1 is turned on to that when the second light source 1-2 is turned with the aid of a synchronizing signal from the driving circuit 19, thereby computing an output proportional to the quantity being measured.

In the optical sensing equipment thus constructed, light is allowed to pass through the splitter 17-1, is focused by the micro lens 3-1, and is incident on the optical fiber 2-1 while the light source 1-1 is turned on. The light is converted into a parallel beam by the micro lens 3-2, linearly polarized by the polarizing beam splitter 4, and then made incident on the Pockels element 5, whereby it undergoes an electro-optical effect because of the electric field, causing a double-refractive phenomenon. Although the light is given an optical bias by the eighth-wave plate 6-1 because half the light is reflected by the half-silvered mirror 21 and made to pass through the eighth-wave plate 6-1 again, this is equivalent to the case where the light passes through a quarter-wave plate once.

The reflected light is made to pass through and is modulated by the Pockels element 5 again, and then is subjected to photointensity modulation by the polarizing beam splitter 4. Moreover, the light is again made to pass through the micro lens 3-2, the optical fiber 2-1, and the micro lens 3-1, and is branched off by the splitter 17-1 before being incident on the photodetector 12.

The light transmitted through the half-silvered mirror 21 is not affected by photointensity modulation, even if an electric field is applied thereto. The light is incident on the micro lens 3-3 and made to pass through the micro lens 3-4, branched off in the splitter 17-2, and is incident on the photodetector 13.

Subsequently, when the light source 1-2 is turned on, the light passes through the splitter 17-2, the micro lens 3-4, the optical fiber 2-2, and the micro lens 3-3. Half the light is reflected by the half-silvered mirror 21 and made to follow the aforedescribed path, being subjected to photoelectric conversion in the photodetector 13. Although half the light transmitted through the half-silvered mirror 21 is made to pass through the eighth-wave plate 6-1, the Pockels element 5, and the polarizing beam splitter 4 and is then incident on the micro lens 3-2, it is resistant to photointensity modulation by the electric field. The light is made to pass through the optical fiber 2-1, the micro lens 3-1, branched off by the splitter 17-1, and is then subjected to photoelectric conversion.

The light sources 1-1 and 1-2 are alternately driven by the driving circuit 19 on a time sharing basis. The divider 16 takes the ratio between the outputs of the photodetectors 12 and 13 once while the light source 1-1 is turned on and again while the light source 1-2 is turned on, synchronously with the signal from the driving circuit 19, to thus compute an output proportional to the quantity being measured. Hence, the magnitude of the electric field can be measured without being affected by fluctuations of the light source and the optical fiber.

For this embodiment, when the light source 1-1 is turned on, output of the photoreceiver 12: $D_{1-1}$, output of the photoreceiver 13: $D_{2-1}$; and when the light source 1-2 is turned on, output of the photoreceiver 12: $D_{1-2}$, output of the photoreceiver 13: $D_{2-2}$ are respectively:

$$D_{1-1} \propto P_1 \cdot M_1 \cdot K_1 \cdot \tfrac{1}{2} \cdot \alpha \cdot \tfrac{1}{2} \cdot \beta \cdot K_1 \cdot M_2 \tag{8}$$

$$D_{2-1} \propto P_1 \cdot M_1 \cdot K_1 \cdot \tfrac{1}{2} \cdot \beta \cdot \tfrac{1}{2} \cdot K_2 \cdot L_2 \tag{9}$$

$$D_{1-2} \propto P_2 \cdot L_1 \cdot K_2 \cdot \tfrac{1}{2} \cdot \beta \cdot \tfrac{1}{2} \cdot K_1 \cdot M_2 \tag{10}$$

$$D_{2-2} \propto P_2 \cdot L_1 \cdot K_2 \cdot \tfrac{1}{2} \cdot \tfrac{1}{2} \cdot K_2 \cdot L_2 \tag{11}$$

where:
intensity of the light source 1-1 = $P_1$,
intensity of the light source 1-2 = $P_2$,
transmission factor of the splitter 17-1 on its light source side = $M_1$,
transmission factor of the splitter 17-1 on its photodetector side = $M_2$,
transmission factor of the splitter 17-2 on its light source side = $L_1$,
transmission factor of the splitter 17-2 on its photodetector side = $L_2$,
transmission factor of the optical fiber 2-1 (including the micro lenses 3-1, 3-2) = $K_1$,
transmission factor of the optical fiber 2-2 (including the micro lenses 3-3, 3-4) = $K_2$,
coupling factor of the splitter 17-2 = $\tfrac{1}{2}$,
transmission factor of the modulated light incident on and radiated from the polarized beam splitter using a combination of the polarized beam splitter 4, the Pockels element 5, the eighth-wave plate 6-1, and the half-silvered mirror 21 = $\alpha$, and
transmissioin factor of the Pockels element 5 and the eighth-wave plate 6-1 = $\beta$.

If expression 8 is divided by expression 9 and expression (10) by expression (11), the following is obtained:

$$D_{1-1}/D_{2-1} \propto \alpha \cdot \beta \cdot K_1 \cdot M_2 / K_2 \cdot L_2 \tag{12}$$

$$D_{1-2}/D_{2-2} \propto \tfrac{1}{2} \cdot \beta \cdot K_1 \cdot H_2 / K_2 \cdot L_2 \tag{13}$$

If expression (12) is further divided by expression (13), the value obtained is proportional to 2, and hence terms corresponding to losses of the light sources and optical fibers are eliminated. Accordingly, an optical sensing equipment free from the affects of loss fluctuations in the optical fibers and light sources is obtained.

Although a Pockels element is used as a modulator element in the embodiment above, as in the case of the first embodiment, a bismuth-germanium-oxide ($Bi_{12}SiO_{20}$) element may be used. When an electric field or voltage is to be measured, an eighth-wave plate may be inserted between the polarizer and the modulator element, and when a magnetic field or current is to be measured, the length of the bismuth-germanium-oxide or bismuth-silicon-oxide element should be determined so that the plate of polarization is rotated 45° in terms of rotary power.

A material having a photoelastic effect may be used for the modulator element. When a pressure is to be measured, an eighth-wave plate may be inserted between the polarizer and the modulator element. A Faraday element may also be used as the modulator element. Moreover, polarizing beam splitters are usable as the splitters 17-1, 17-2.

I claim:
1. An optical sensing equipment comprising: a first light source; a first splitter receiving light from said first light source; a first photodetector arranged at one output of said first splitter; a first optical fiber; a second light source; a second splitter receiving light from said second light source; a second photodetector arranged at one output of said second splitter; a second optical fiber; an optical sensor coupled to the other outputs of said first and second splitters through said first and second optical fibers, respectively, said optical sensor comprising a polarizer, a modulator element, and fully reflecting mirror arranged in the stated order from said first and second optical fibers; a driving circuit for alter- nately driving said first and second light sources; a divider for determining a first ratio of outputs of said first and second photodetectors when said first light source is turned on and a second ratio of outputs of said first and second photodetectors when said second light source is turned on; and means for calculating a ratio between said first and second ratios to thereby provide an output proportional to a quantity being measured.

2. The optical sensing equipment as claimed in claim 1, wherein, for measurement of an electric field or voltage, said modulator element comprises one of a bismuth-geranium-oxide element and a bismuth-silicon-oxide element, and an eighth-wave plate disposed between said polarizer and said modulator element.

3. The optical sensing equipment as claimed in claim 1, wherein, for measuring a magnetic field or current, said modulator element comprises one of a bismuth-geranium-oxide element and a bismuth-silicon-oxide element having a length determined so that a plane of polarization rotated through 45°.

4. The optical sensing equipment as claimed in claim 1, wherein, for measurement of a pressure or displacement, said modulator element comprises a body of material having a photoelastic effect, and further comprising an eighth-wave plate inserted between said polarizer and said modulator element.

5. The optical sensing equipment as claimed in claim 1, wherein said modulator element comprises one of a Faraday element and Pockels element.

6. The optical sensing equipment as claimed in claim 1, wherein said splitter comprises a polarizing beam splitter.

7. An optical sensing equipment comprising: a first light source; a first splitter receiving light from said first light source; a first photodetector arranged at one output of said first splitter; a first optical fiber; a second light source; a first optical fiber; an optical sensor coupled to the other end of said splitter and receiving light therefrom through said first optical fiber, said optical sensor comprising a polarizer, a modulator element, and a half-silvered mirror arranged in the stated order from said first optical fiber; a second optical fiber; a second splitter optically coupled to a surface of said half-silvered mirror opposite said modulator element through said second optical fiber; a second photodetector arranged at an output of said second splitter; a second light source, said second splitter receiving light from said second light source; a driving circuit for alternately driving said first and second light sources; a divider for determining a first ratio of outputs of said first and second photodetectors when said first light source is turned on and a second ratio of outputs of said first and second photodetectors when said second light source is turned on; and means for calculating a ratio between said first and second ratios to thereby provide an output proportional to a quantity being measured.

8. The optical sensing equipment as claimed in claim 7, wherein, for measurement of an electric field or voltage, said modulator element comprises one of a bismuth-germanium-oxide element and a bismuth-silicon-oxide element, and an eighth-wave plate disposed between said polarizer and said modulator element.

9. The optical sensing equipment as claimed in claim 7, wherein, for measurement of a magnetic field or current, said modulator element comprises one of a bismuth-geranium-oxide element and a bismuth-silicon-oxide element having a length determined so that a plane of polarization rotated through 45°.

10. The optical sensing equipment as claimed in claim 7, wherein, for measurement of a pressure or displacement, said modulator element comprises a body of material having a photoelastic effect, and further comprising an eighth-wave phase plate inserted between said polarizer and said modulator element.

11. The optical sensing equipment as claimed in claim 7, wherein said modulator element comprises one of a Faraday element and a Pockels element.

12. The optical sensing equipment as claimed in claim 7, wherein said splitter comprises a polarizing beam splitter.

* * * * *